United States Patent
Lee et al.

(10) Patent No.: US 11,081,055 B2
(45) Date of Patent: Aug. 3, 2021

(54) ACTIVE MATRIX-BASED ELECTRONIC APPARATUS INCLUDING A LIGHT EMITTING DEVICE THAT MAY BE NON-FOWARD BIASED TO SENSE LIGHT, AND METHOD OF DRIVING THE SAME

(71) Applicant: UNIVERSITY-INDUSTRY COOPERATION GROUP OF KYUNG HEE UNIVERSITY, Yongin-si (KR)

(72) Inventors: Seung-Woo Lee, Seoul (KR); Jongbin Kim, Seongnam-si (KR); Woo Rim Lee, Seoul (KR)

(73) Assignee: UNIVERSITY-INDUSTRY COOPERATION GROUP OF KYUNG HEE UNIVERSITY, Yongin-si (KR)

(*) Notice: Subject to any disclaimer, the term of this patent is extended or adjusted under 35 U.S.C. 154(b) by 0 days.

(21) Appl. No.: 16/801,449

(22) Filed: Feb. 26, 2020

(65) Prior Publication Data

US 2021/0020106 A1    Jan. 21, 2021

(30) Foreign Application Priority Data

Jul. 19, 2019   (KR) ........................ 10-2019-0087564

(51) Int. Cl.
*G09G 5/10* (2006.01)
*G09G 3/3258* (2016.01)
*H01L 27/32* (2006.01)

(52) U.S. Cl.
CPC ....... *G09G 3/3258* (2013.01); *H01L 27/3269* (2013.01); *G09G 2320/0626* (2013.01); *G09G 2360/144* (2013.01)

(58) Field of Classification Search
None
See application file for complete search history.

(56) References Cited

U.S. PATENT DOCUMENTS 6,144,162 A * 11/2000 Smith ............... G09G 3/3208
                                                       315/169.1
9,570,002 B2    2/2017 Sakariya et al.
(Continued)

FOREIGN PATENT DOCUMENTS

KR   10-2004-0037829 A    5/2004
KR   10-2005-0021989 A    3/2005
(Continued)

OTHER PUBLICATIONS

Communication dated Jul. 29, 2020, issued by the Korean Patent Office in counterpart Korean Application No. 10-2019-0087564.
(Continued)

*Primary Examiner* — Kirk W Hermann
(74) *Attorney, Agent, or Firm* — Sughrue Mion, PLLC

(57) ABSTRACT

Disclosed are an active matrix-based electronic apparatus and a method of driving the same. More particularly, a pixel circuit of an electronic apparatus according to an embodiment of the present disclosure may include a light-emitting driver configured to apply a forward bias to a light-emitting device in an emission mode to control light to be emitted through the light-emitting device; a sensing driver configured to apply a non-forward bias to the light-emitting device in a sensing mode to control an electrical signal corresponding to light incident on the light-emitting device to be generated; and a reader configured to read intensity of light corresponding to the generated electrical signal.

12 Claims, 9 Drawing Sheets

(56) References Cited

U.S. PATENT DOCUMENTS

| | | | |
|---|---|---|---|
| 2013/0221856 A1* | 8/2013 | Soto | H05B 45/60 |
| | | | 315/152 |
| 2016/0078270 A1* | 3/2016 | Lee | G06K 9/001 |
| | | | 382/125 |

FOREIGN PATENT DOCUMENTS

| | | |
|---|---|---|
| KR | 10-2015-0120001 A | 10/2015 |
| KR | 10-2016-0069986 A | 6/2016 |

OTHER PUBLICATIONS

Communication dated Oct. 23, 2020, issued by the Korean Patent Office in counterpart Korean Application No. 10-2019-0087564.

* cited by examiner

【FIG. 1】
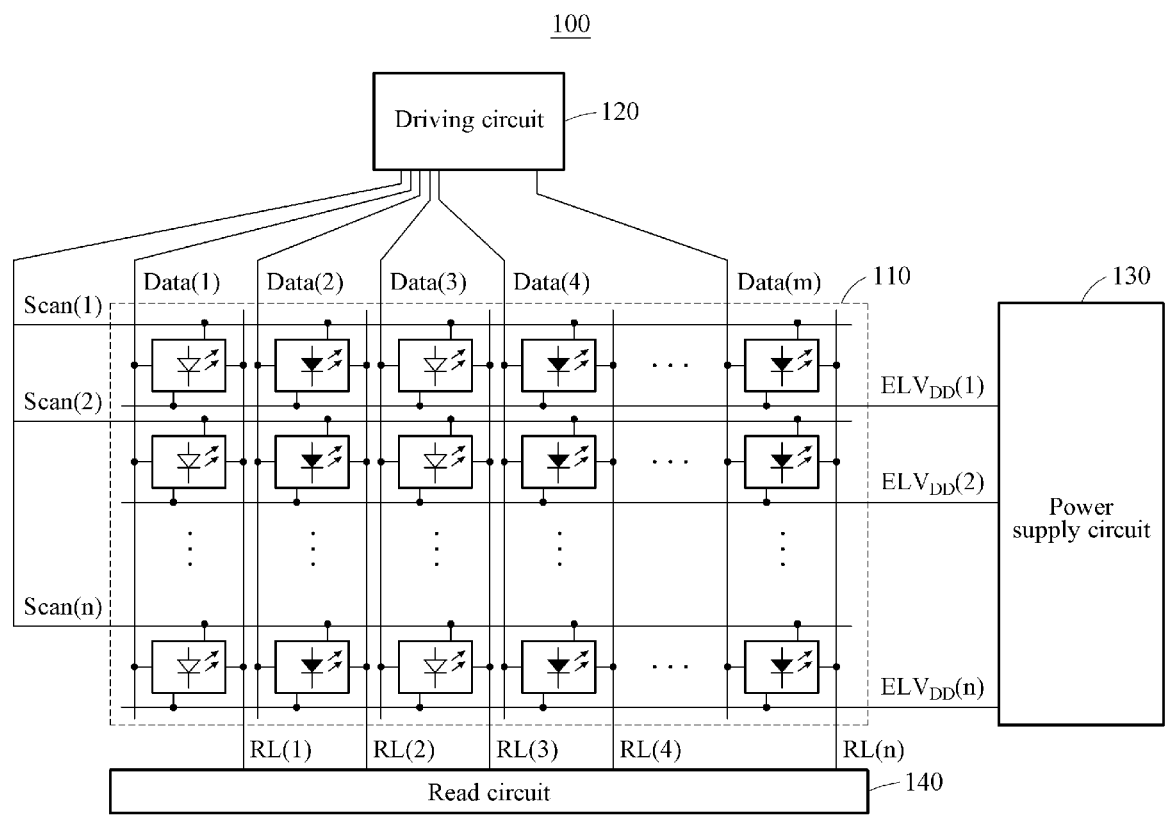

【FIG. 2】
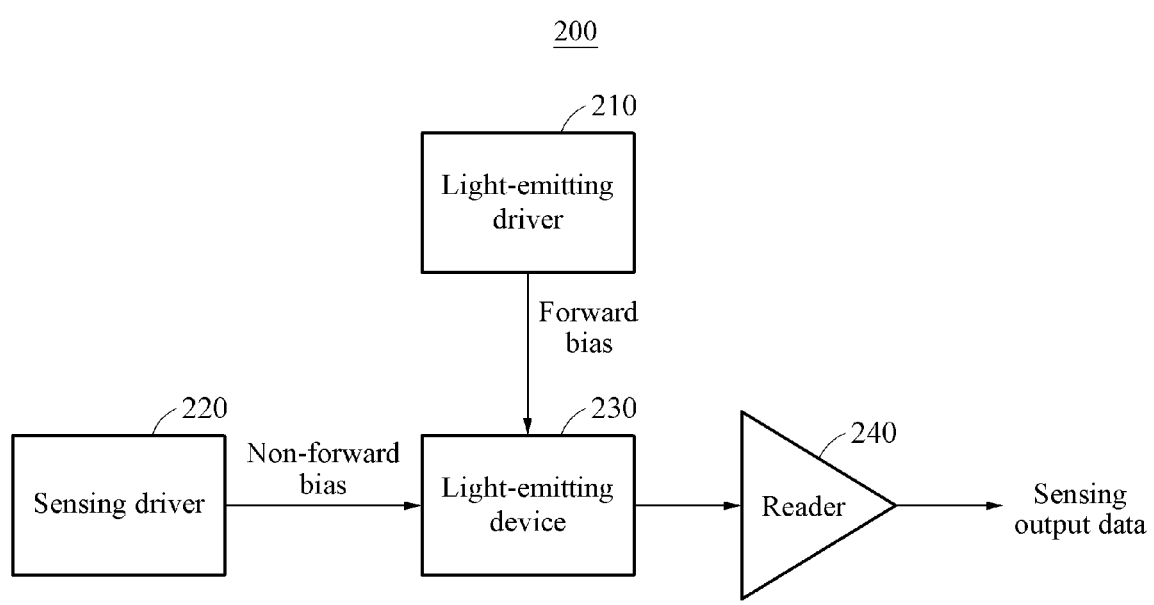

[FIG. 3A]
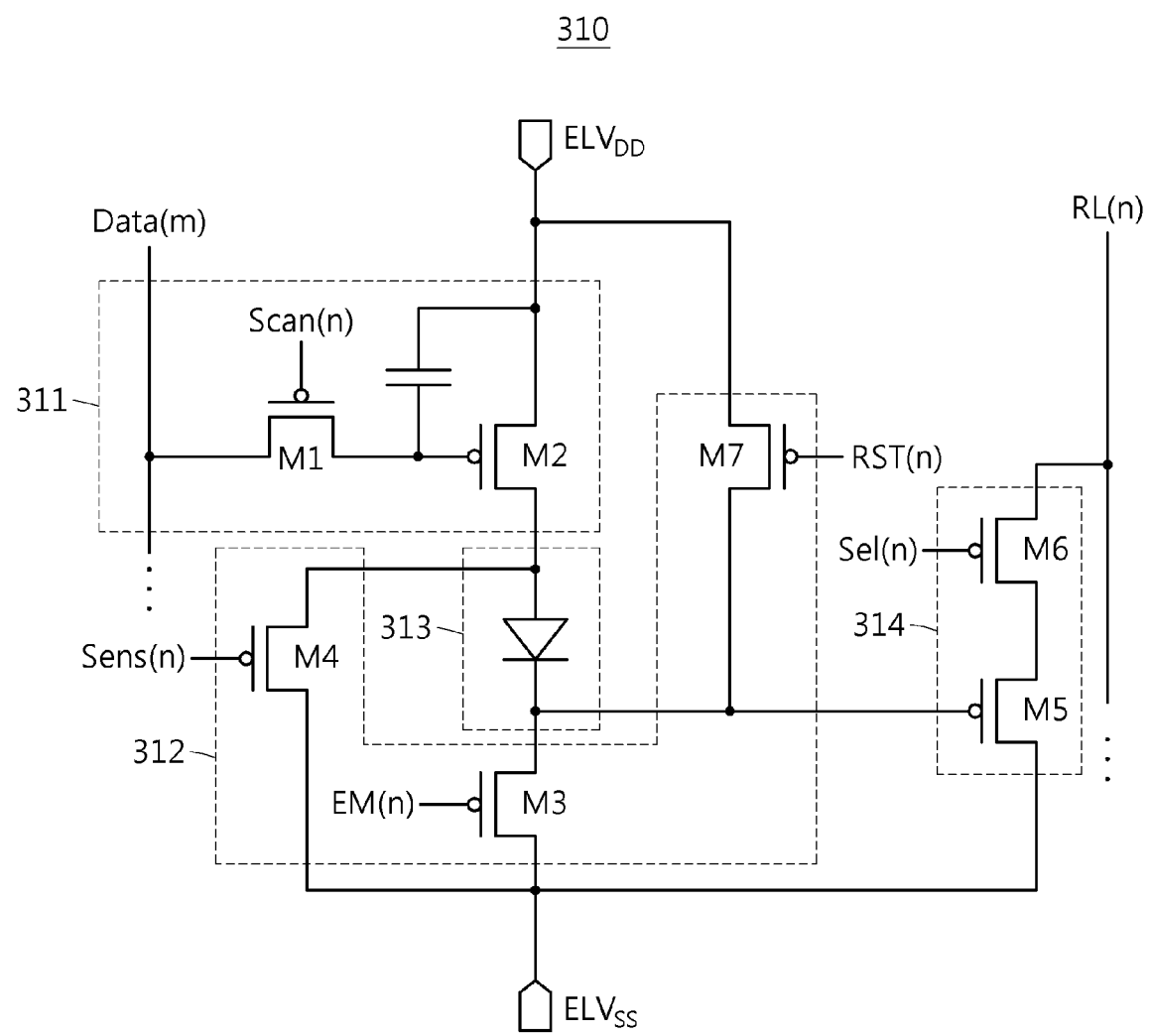

[FIG. 3B]
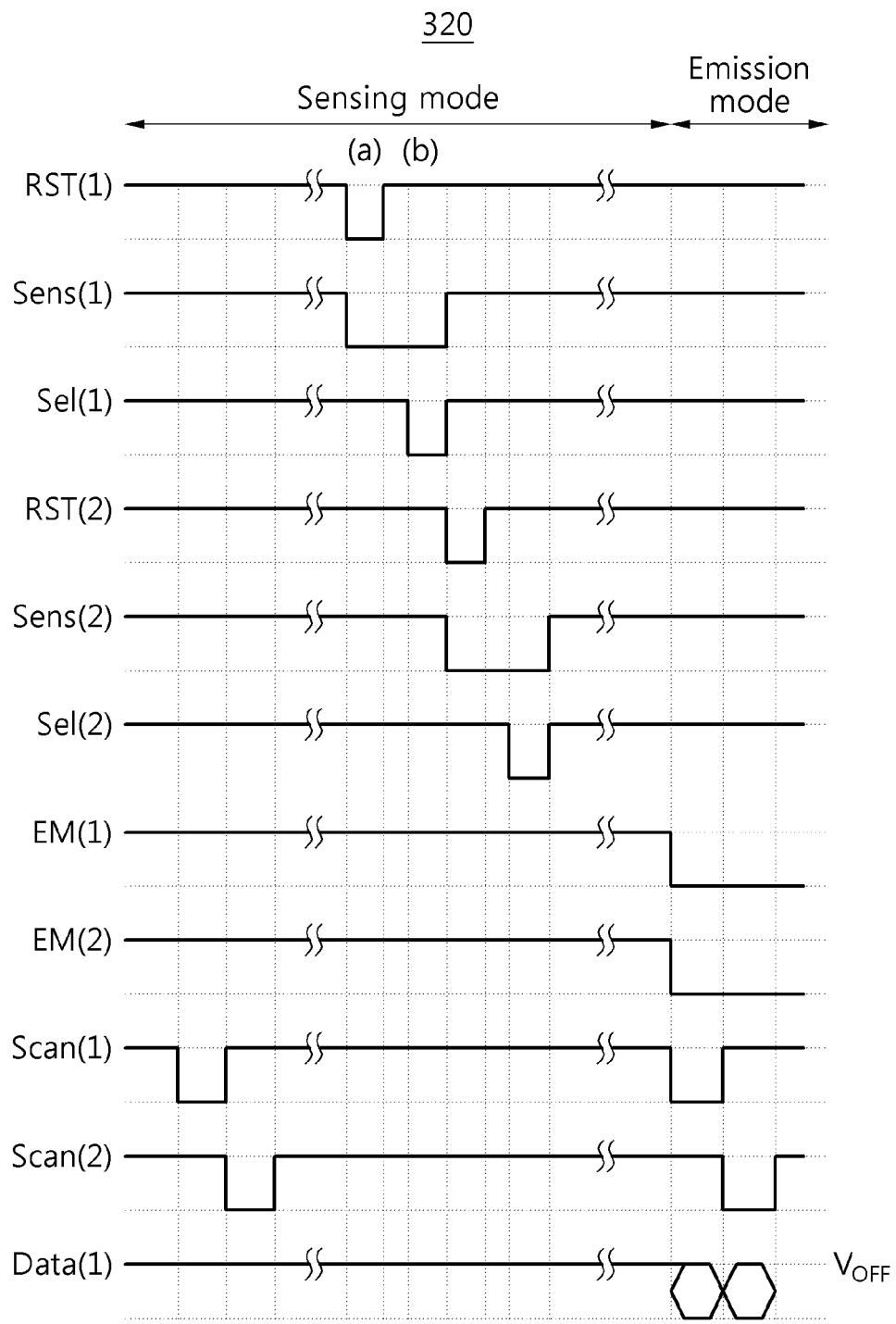

[FIG. 4A]
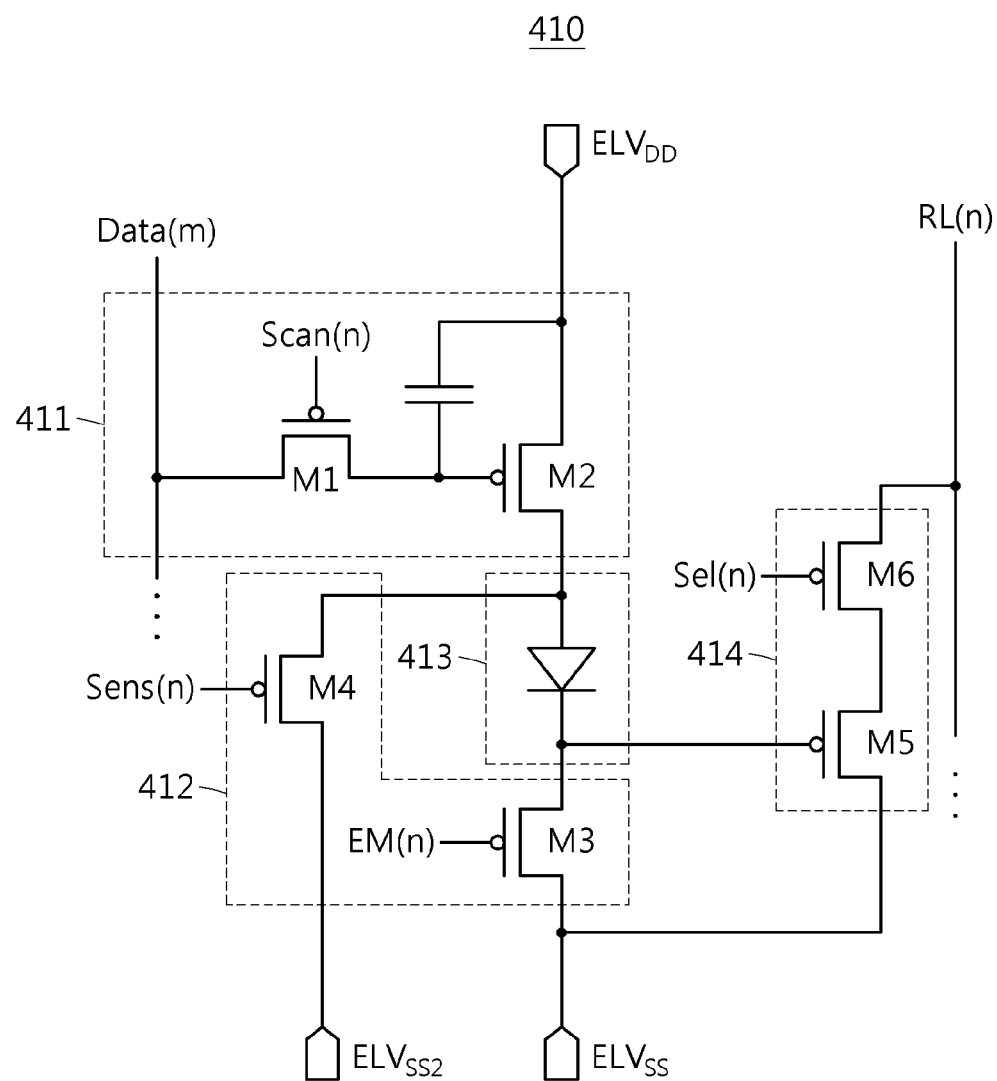

[FIG. 4B]
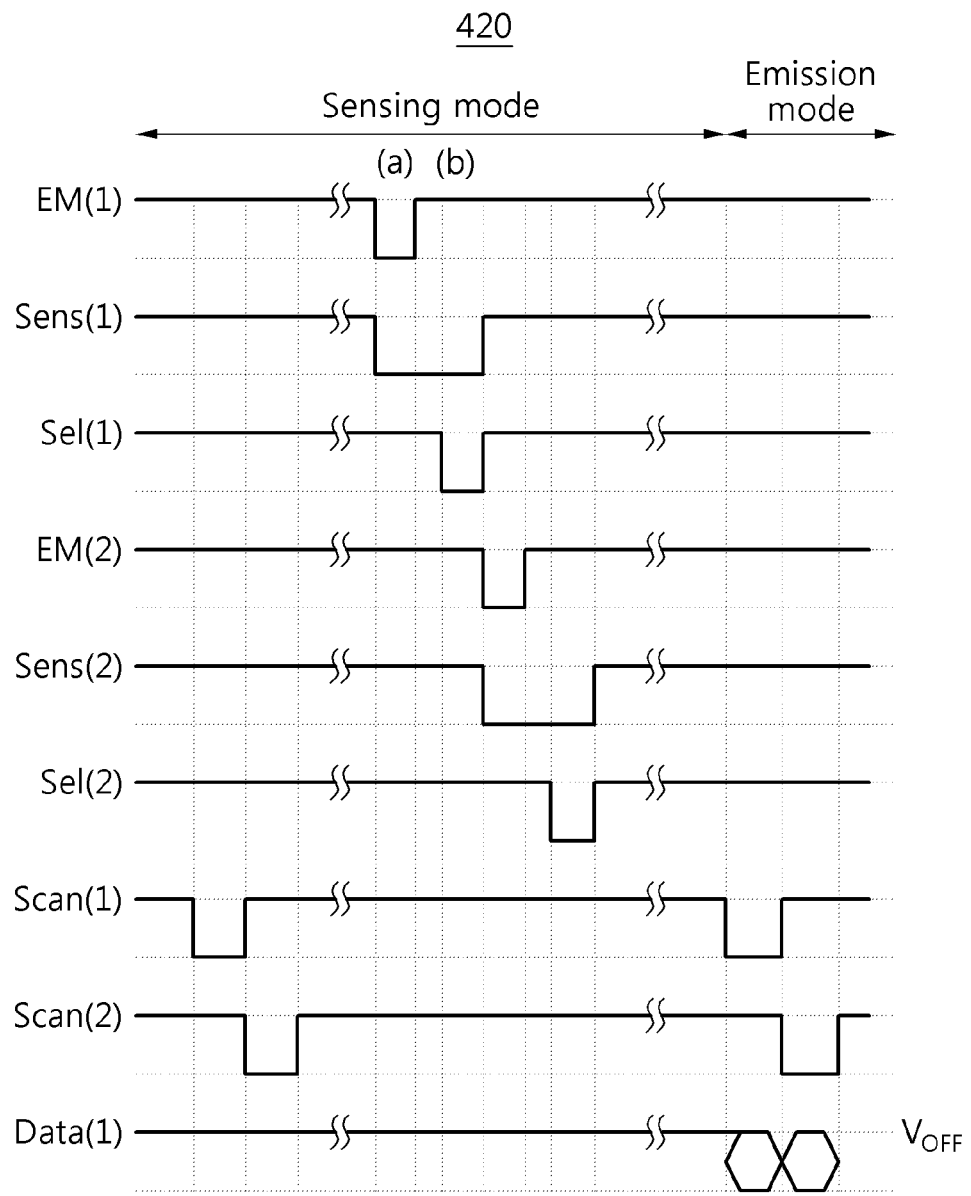

[FIG. 5A]
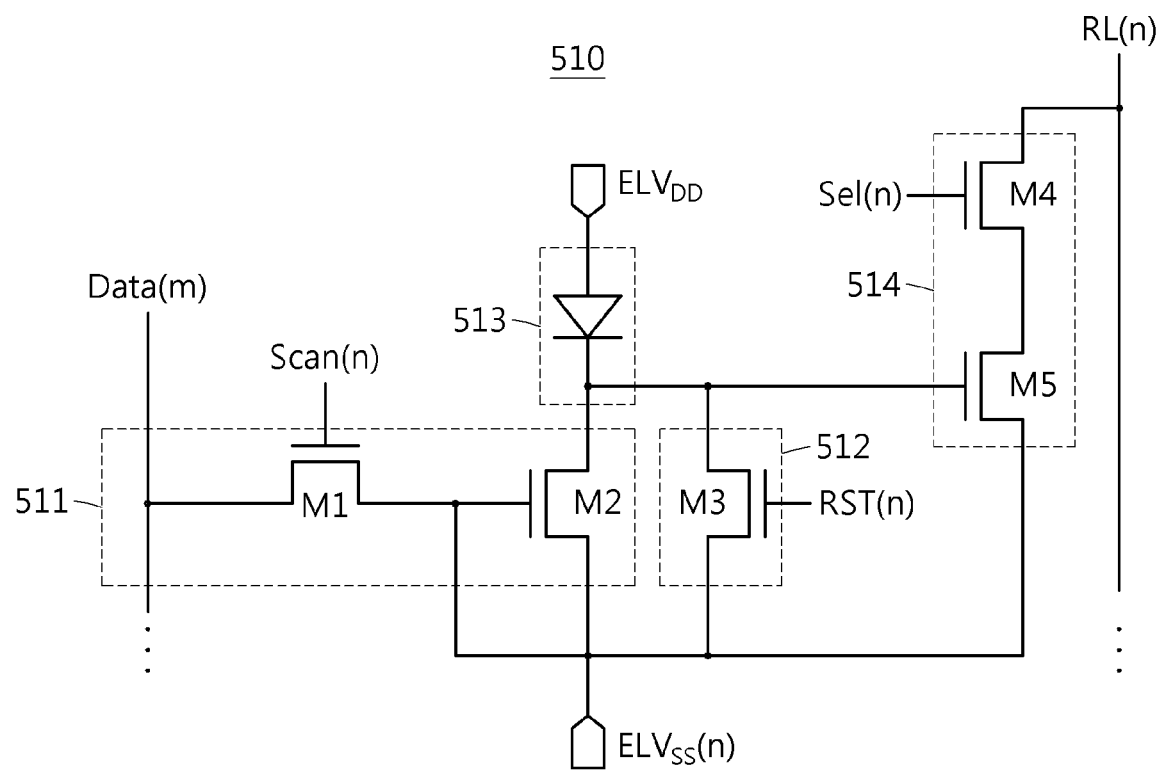

[FIG. 5B]
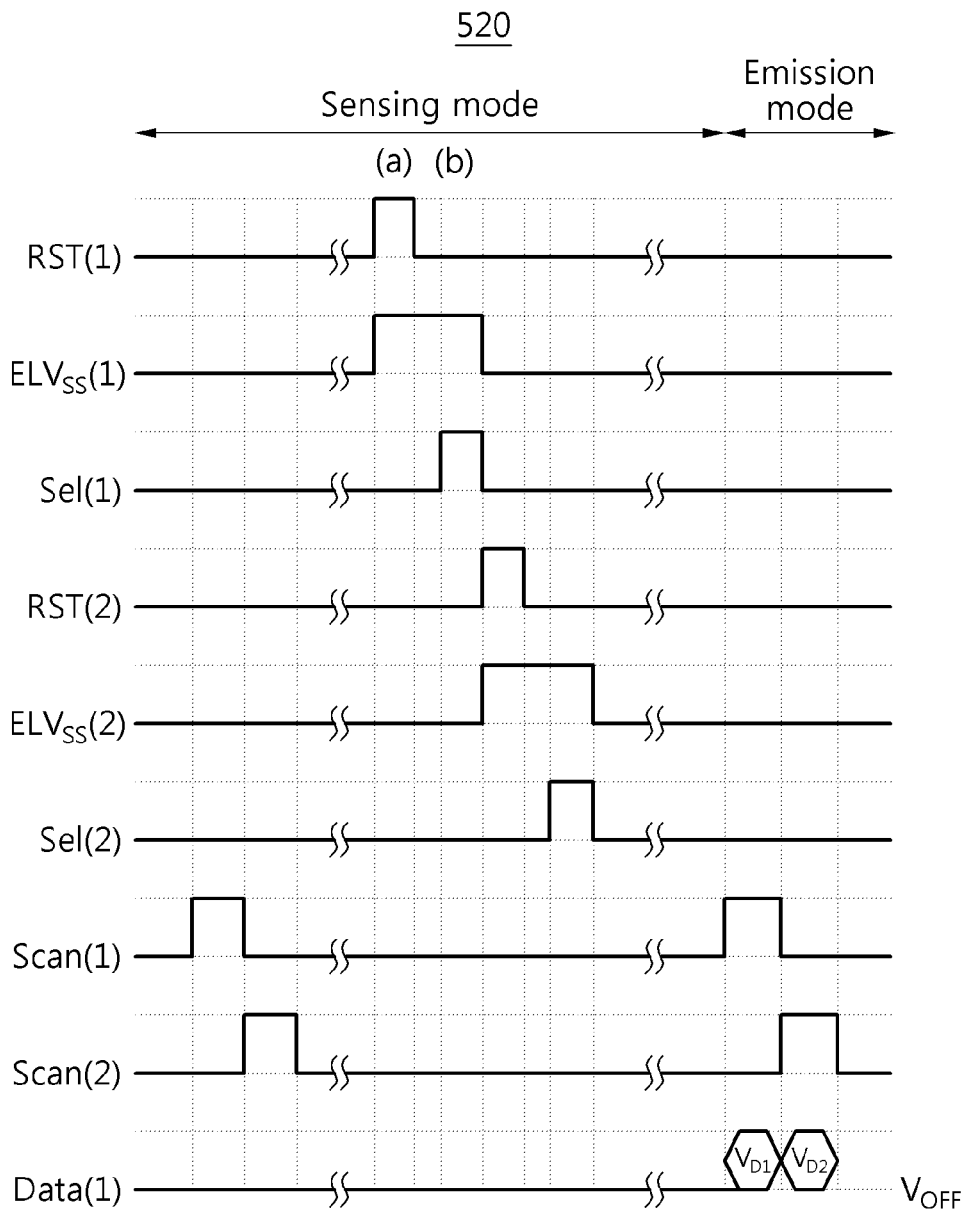

[FIG. 6]
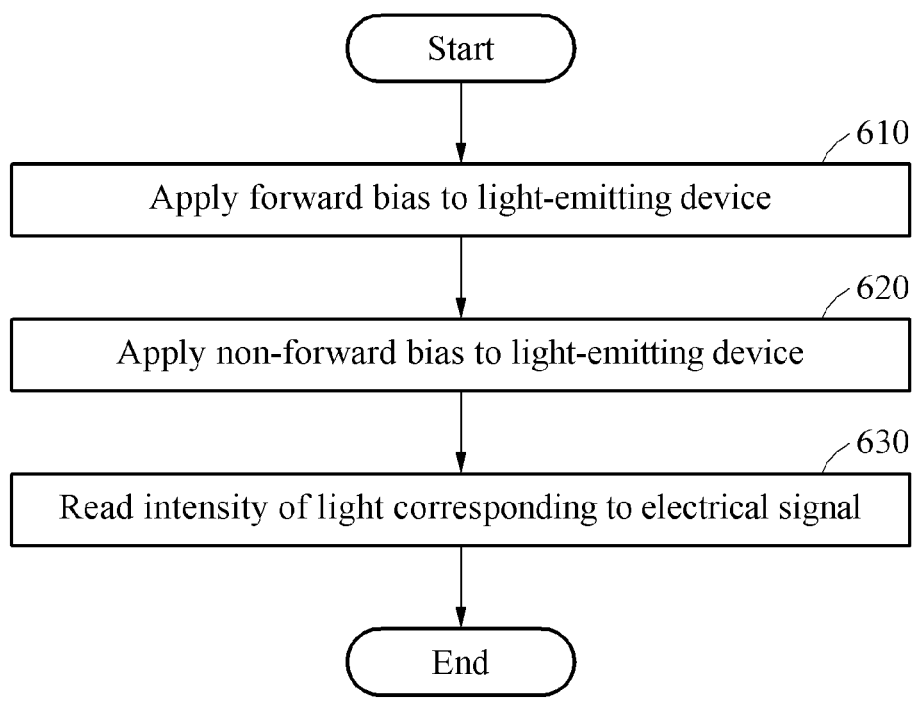

ACTIVE MATRIX-BASED ELECTRONIC APPARATUS INCLUDING A LIGHT EMITTING DEVICE THAT MAY BE NON-FOWARD BIASED TO SENSE LIGHT, AND METHOD OF DRIVING THE SAME

CROSS-REFERENCE TO RELATED APPLICATION

This application claims the priority benefit of Korean Patent Application No. 10-2019-0087564, filed on Jul. 19, 2019 in the Korean Intellectual Property Office, the disclosure of which is incorporated herein by reference.

BACKGROUND OF THE DISCLOSURE

Field of the Disclosure

The present disclosure relates to an active matrix-based electronic apparatus and a method of driving the same, and more particularly to a technical idea of simultaneously emitting and detecting light using a single light-emitting device.

Description of the Related Art

Recently, efforts have been made to provide separate functions, in addition to a display function of a display device, to display devices of portable electronic devices as demand for portable electronic devices has increased. In particular, research is being conducted to realize various functions utilizing an optical sensor that senses external light or the light of a display itself.

As a particular example, additional circuits, such as an ambient light-sensing circuit that senses light around a display and, accordingly, adjusts the brightness of the display; and a touch panel circuit that senses an area covered by a hand using light around a display or the light of a display itself, are applied to existing display apparatuses to realize multifunctional display devices.

However, in the case of the aforementioned multifunction display technologies, the sizes of display apparatuses are increased because additional circuits are mounted therein. Accordingly, there is a limitation in miniaturizing a device.

RELATED ART DOCUMENT

Patent Document

U.S. Pat. No. 9,570,002 entitled "INTERACTIVE DISPLAY PANEL WITH IR DIODES"

SUMMARY OF THE DISCLOSURE

Therefore, the present disclosure has been made in view of the above problems, and it is one object of the present disclosure to provide an electronic apparatus performing light emission and sensing functions using a light-emitting device in a pixel, instead of an external apparatus or a separate substrate, thereby being capable of realizing miniaturization and weight reduction; and a method of driving the electronic apparatus.

It is another object of the present disclosure to provide an electronic apparatus performing light emission and sensing functions in an active matrix driving manner, thereby being capable of shortening a detection time of light intensity change and more accurately detecting changes in light intensity due to relatively low crosstalk, compared to a passive matrix driving manner; and a method of driving the electronic apparatus.

In accordance with an aspect of the present disclosure, the above and other objects can be accomplished by the provision of a pixel circuit of an electronic apparatus, the pixel circuit including: a light-emitting driver configured to apply a forward bias to a light-emitting device in an emission mode to control light to be emitted through the light-emitting device; a sensing driver configured to apply a non-forward bias to the light-emitting device in a sensing mode to control an electrical signal corresponding to light incident on the light-emitting device to be generated; and a reader configured to read intensity of light corresponding to the generated electrical signal.

In accordance with an aspect of the present disclosure, the light-emitting driver may include a first transistor provided between a data line and a power source voltage line; and a second transistor connected to a drain terminal of the first transistor through a gate terminal and provided between the power source voltage line and an anode of the light-emitting device.

In accordance with an aspect of the present disclosure, the light-emitting driver may further include a capacitor provided between the drain terminal of the first transistor and the power source voltage line.

In accordance with an aspect of the present disclosure, the sensing driver may include a third transistor provided between a cathode of the light-emitting device and a ground voltage line; a fourth transistor provided between the ground voltage line and an anode of the light-emitting device; and a seventh transistor provided between the power source voltage line and the cathode of the light-emitting device.

In accordance with an aspect of the present disclosure, the sensing driver may include a third transistor provided between a cathode of the light-emitting device and a first ground voltage lines; and a fourth transistor provided between an anode of the light-emitting device and a second ground voltage line.

In accordance with an aspect of the present disclosure, the first ground voltage line may be applied with a first ground voltage that has a higher level than that of a second ground voltage applied through the second ground voltage line.

In accordance with an aspect of the present disclosure, the light-emitting driver may include a first transistor provided between a data line and a ground voltage line; and a second transistor connected to a source terminal of the first transistor through a gate terminal and provided between a cathode of the light-emitting device, which is connected to a power source voltage line through an anode, and the ground voltage line.

In accordance with an aspect of the present disclosure, the light-emitting driver may further include a capacitor provided between the source terminal of the first transistor and the ground voltage line.

In accordance with an aspect of the present disclosure, the sensing driver may include a third transistor provided between the cathode of the light-emitting device and the ground voltage line.

In accordance with an aspect of the present disclosure, the ground voltage line may be applied with a second power source voltage that has a higher level than that of a first power source voltage applied to the power source voltage line, for a preset time section in the sensing mode.

In accordance with an aspect of the present disclosure, the reader may include a source follower transistor, a fifth transistor, connected to a cathode of the light-emitting device through a gate terminal; and a sixth transistor provided between the fifth transistor and a read line.

In accordance with an aspect of the present disclosure, the sensing driver may apply the non-forward bias to the light-emitting device to control the electrical signal corresponding to light emitted from an adjacent pixel to be generated.

In accordance with another aspect of the present disclosure, there is provided a method of driving a pixel circuit of an electronic apparatus, the method including: applying, by a light-emitting driver, a forward bias to a light-emitting device in an emission mode to control light to be emitted through the light-emitting device; applying, by a sensing driver, a non-forward bias to the light-emitting device in a sensing mode to control an electrical signal corresponding to light incident on the light-emitting device to be generated; and reading, by a reader, intensity of light corresponding to the generated electrical signal.

In accordance with an aspect of the present disclosure, in the applying of the non-forward bias, the non-forward bias may be applied to the light-emitting device to control the electrical signal, which corresponds to light emitted from an adjacent pixel, to be generated.

BRIEF DESCRIPTION OF THE DRAWINGS

The above and other objects, features and other advantages of the present disclosure will be more clearly understood from the following detailed description taken in conjunction with the accompanying drawings, in which:

FIG. 1 is a drawing illustrating an electronic apparatus according to an embodiment of the present disclosure;

FIG. 2 is a drawing illustrating a pixel circuit of an electronic apparatus according to an embodiment of the present disclosure;

FIGS. 3A and 3B are drawings illustrating a pixel circuit according to a first embodiment of the present disclosure;

FIGS. 4A and 4B are drawings illustrating a pixel circuit according to a second embodiment of the present disclosure;

FIGS. 5A and 5B are drawings illustrating a pixel circuit according to a third embodiment of the present disclosure; and FIG. 6 is a drawing illustrating a method of driving a pixel circuit of an electronic apparatus according to an embodiment of the present disclosure.

DETAILED DESCRIPTION OF THE DISCLOSURE

Specific structural and functional descriptions of embodiments according to the concept of the present disclosure disclosed herein are merely illustrative for the purpose of explaining the embodiments according to the concept of the present disclosure. Furthermore, the embodiments according to the concept of the present disclosure can be implemented in various forms and the present disclosure is not limited to the embodiments described herein.

The embodiments according to the concept of the present disclosure may be implemented in various forms as various modifications may be made. The embodiments will be described in detail herein with reference to the drawings. However, it should be understood that the present disclosure is not limited to the embodiments according to the concept of the present disclosure, but includes changes, equivalents, or alternatives falling within the spirit and scope of the present disclosure.

The terms such as "first" and "second" are used herein merely to describe a variety of constituent elements, but the constituent elements are not limited by the terms. The terms are used only for the purpose of distinguishing one constituent element from another constituent element. For example, a first element may be termed a second element and a second element may be termed a first element without departing from the scope of rights according to the concept of the present disclosure.

It will be understood that when an element is referred to as being "on", "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Other words used to describe the relationship between elements should be interpreted in a like fashion (e.g., "between," versus "directly between," "adjacent," versus "directly adjacent," etc.).

The terms used in the present specification are used to explain a specific exemplary embodiment and not to limit the present inventive concept. Thus, the expression of singularity in the present specification includes the expression of plurality unless clearly specified otherwise in context. Also, terms such as "include" or "comprise" in the specification should be construed as denoting that a certain characteristic, number, step, operation, constituent element, component or a combination thereof exists and not as excluding the existence of or a possibility of an addition of one or more other characteristics, numbers, steps, operations, constituent elements, components or combinations thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present disclosure will now be described more fully with reference to the accompanying drawings, in which exemplary embodiments of the disclosure are shown. This disclosure may, however, be embodied in many different forms and should not be construed as limited to the exemplary embodiments set forth herein. Like reference numerals in the drawings denote like elements.

FIG. 1 is a drawing illustrating an electronic apparatus according to an embodiment of the present disclosure.

Referring to FIG. 1, an electronic apparatus 100 according to an embodiment of the present disclosure performs light emission and sensing functions using a light-emitting device in a pixel, instead of an external apparatus or a separate substrate, which allows miniaturization and weight reduction of an electronic apparatus.

In addition, the electronic apparatus 100 performs light emission and sensing functions in an active matrix driving manner, thereby being capable of shortening a detection time of light intensity change and more accurately detecting changes in light intensity due to relatively low crosstalk, compared to a passive matrix driving manner.

For this, the electronic apparatus 100 according to the embodiment of the present disclosure may include a pixel array 110, a driving circuit 120, a power supply circuit 130, and a read circuit 140.

In accordance with an aspect of the present disclosure, the electronic apparatus 100 according to the embodiment of the present disclosure may be a display apparatus or a sensing apparatus. Here, the sensing apparatus may be an image sensor. However, the electronic apparatus 100 according to the embodiment of the present disclosure is not limited to the examples, and may be various types of electronic apparatuses performing a light emission or sensing function.

For example, the electronic apparatus 100 according to the embodiment of the present disclosure may further include a controller configured to control the operations of the driving circuit 120, the power supply circuit 130, and the read circuit 140 in response to a preset emission mode and sensing mode.

In addition, the pixel array 110 may include a plurality of pixels corresponding to intersections of a plurality of scan lines for respectively applying a plurality of scan signals, Scan (1) to Scan(n), and a plurality of data lines for respectively applying a plurality of data signals, Data (1) to Data(m). Each of the plurality of pixels may include a pixel circuit including a single light-emitting device. Here, n and m may be positive integers.

For example, the light-emitting device may be a light-emitting diode, preferably an organic light-emitting diode (OLED).

In accordance with an aspect of the present disclosure, the light-emitting device provided in each of the plurality of pixels may emit light in an emission mode and may sense light incident to the light-emitting device in a sensing mode, through an operation of the pixel circuit.

Particularly, the light-emitting device may emit light when a forward bias is applied and, when light is incident on the light-emitting device while the non-forward bias is applied, may generate an electrical signal corresponding to the incident light. For example, the electrical signal according to an embodiment of the present disclosure may be a photo current.

In other words, the electronic apparatus 100 according to the embodiment of the present disclosure may simultaneously perform light emission and light sensing functions by controlling a bias applied to the light-emitting device, without a separate additional circuit.

More particularly, the driving circuit 120 according to an embodiment of the present disclosure may provide scan signals, Scan (1) to Scan(n), and data signals, Data (1) to Data(m), to pixels respectively corresponding to the plurality of scan lines and the plurality of data lines, for active matrix driving of each of the pixels.

In addition, the power supply circuit 130 according to an embodiment of the present disclosure may provide power source voltage ($ELV_{DD}$) to each of the pixels through power source voltage lines, $ELV_{DD}$ (1) to $ELV_{DD}$ (n), and may provide ground voltage ($ELV_{SS}$) to each of the pixels through ground voltage lines, $ELV_{SS}$ (1) to $ELV_{SS}$ (n), so as to apply a forward bias or a non-forward bias to the light-emitting device included in each of the pixels.

For example, the power source voltage ($ELV_{DD}$) and the ground voltage $ELV_{SS}$ may be divided into predetermined levels. More particularly, the power source voltage ($ELV_{DD}$) may include a first power source voltage and a second power source voltage having a level higher than the first power source voltage, and the ground voltage $ELV_{SS}$ may include a first ground voltage and a second ground voltage having a level lower than the first ground voltage.

Meanwhile, the levels of the power source voltage ($ELV_{DD}$) and the ground voltage $ELV_{ss}$ may be determined by a user or according to a predetermined process condition.

The read circuit 140 according to an embodiment of the present disclosure may include a sensing circuit that senses the intensity of light corresponding to an electrical signal generated in each pixel using a plurality of read lines, RL(1) to RL(n), and processes a signal corresponding to the sensed light intensity.

In accordance with an aspect of the present disclosure, the driving circuit 120 and the power supply circuit 130 may control active matrix driving of each pixel to simultaneously perform a display function and a light sensing function.

As a more particular example, the driving circuit 120 and the power supply circuit 130 may apply a forward bias to light-emitting devices of pixels, corresponding to odd-numbered data lines, providing data signals, Data (1), Data (3), . . . , Data (m−1), so as to control to emit light and may apply a non-forward bias to light-emitting devices of pixels, corresponding to even-numbered data lines, applying data signals, Data (2), Data (4), . . . , Data(m), so as to control to sense incident light.

That is, the electronic apparatus 100 according to the embodiment of the present disclosure may control the light-emitting device corresponding to the odd-numbered data lines to serve as light emitters and may control the light-emitting devices corresponding to the even-numbered data lines to serve as light receivers, thereby being capable of functioning as an ambient light-sensing circuit configured to adjust the brightness of a display by sensing surrounding light using a light-emitting device included in a display apparatus; or a touch panel configured to sense a part covered by the hand using light around a display or the light of a display itself.

FIG. 2 is a drawing illustrating a pixel circuit of an electronic apparatus according to an embodiment of the present disclosure.

In other words, FIG. 2 illustrates a structure of the pixel circuit of the electronic apparatus according to an embodiment of the present disclosure shown in FIG. 1. In describing FIG. 2, parts overlapping with those described in FIG. 1 are omitted.

Referring to FIG. 2, a pixel circuit 200 according to an embodiment of the present disclosure may include a light-emitting driver 210, a sensing driver 220, a light-emitting device 230, and a reader 240.

For example, the light-emitting device 230 may be a light-emitting diode, preferably an organic light-emitting diode (OLED).

The light-emitting driver 210 according to an embodiment of the present disclosure may apply a forward bias to the light-emitting device 230 in an emission mode to control light to be emitted through the light-emitting device 230.

The sensing driver 220 according to an embodiment of the present disclosure may apply a non-forward bias to the light-emitting device 230 in a sensing mode so as to control to generate an electrical signal corresponding to light incident on the light-emitting device 230. For example, the electrical signal may be a photo current.

In accordance with an aspect of the present disclosure, the sensing driver 220 may apply a non-forward bias to the light-emitting device 230 to control an electrical signal corresponding to light emitted from an adjacent pixel to be generated.

Particularly, when a pixel including the sensing driver 220 according to an embodiment of the present disclosure is a pixel corresponding to an odd-numbered data line and a pixel adjacent to the pixel is a pixel corresponding to an even-numbered data line, the sensing driver 220 may apply a non-forward bias to the light-emitting device 230 to receive light emitted from the adjacent pixel.

The reader 240 according to an embodiment of the present disclosure may read the intensity of light corresponding to a generated electrical signal.

In other words, the reader 240 may provide sensing output data corresponding to the generated electrical signal to a read line.

The detailed configuration of the pixel circuit 200 according to an embodiment of the present disclosure will be described in more detail with reference to FIGS. 3A to 5B.

FIGS. 3A and 3B are drawings illustrating a pixel circuit according to a first embodiment of the present disclosure.

In other words, FIGS. 3A and 3B illustrate an embodiment of the pixel circuit of the electronic apparatus according to an embodiment of the present disclosure described with reference to FIGS. 1 and 2. In describing FIGS. 3A and 3B, parts overlapping with those described in FIGS. 1 and 2 are omitted.

Referring to FIGS. 3A and 3B, reference numeral 310 denotes a detailed configuration of a pixel circuit according to a first embodiment included in a pixel corresponding to an nth scan line and an mth data line (wherein n and m are positive integers), and reference numeral 320 illustrates a timing diagram according to an operation of the pixel circuit according to the first embodiment.

As shown in reference numeral 310, the pixel circuit according to the first embodiment may include first to seventh transistors M1 to M7 constituting a light-emitting driver 311, a sensing driver 312 and a reader 314. All of the first to seventh transistors M1 to M7 may be constituted of PMOS transistors.

In addition, Scan(n) may be a scan signal applied to a gate terminal of the first transistor M1, Data(m) may be a data signal applied to a source terminal of the first transistor M1, EM(n) may be a signal applied to a gate terminal of the third transistor M3, and Sens(n) may be a signal applied to a gate terminal of the fourth transistor M4.

In addition, Sel(n) may be a signal applied to a gate terminal of the sixth transistor M6, and RST(n) may be a signal applied to a gate terminal of the seventh transistor M7.

Particularly, the light-emitting driver 311 according to the first embodiment may include the first transistor M1 provided between a data line to which a data signal, Data(m), is applied and a power source voltage line to which a power source voltage, $ELV_{DD}$, is applied; and the second transistor M2 connected to a drain terminal of the first transistor M1 through a gate terminal and provided between the power source voltage line and an anode of a light-emitting device 313.

In addition, the light-emitting driver 311 may further include a capacitor provided between the drain terminal of the first transistor and the power source voltage line.

In addition, the sensing driver 312 may include the third transistor M3 provided between a cathode of the light-emitting device 313 and the ground voltage line to which the ground voltage $ELV_{SS}$ is applied; the fourth transistor M4 provided between the ground voltage line and the anode of the light-emitting device 313; and the seventh transistor M7 provided between the power source voltage line and the cathode of the light-emitting device 313.

In addition, the reader 314 may include a source follower transistor, the fifth transistor M5, connected to the cathode of the light-emitting device through the gate terminal; and the sixth transistor M6 provided between the fifth transistor M5 and the read line, RL(n).

Hereinafter, an operation of the pixel circuit according to the first embodiment illustrated in reference numeral 310 is described in more detail with reference to reference numeral 320.

Referring to reference numerals 310 and 320, the pixel circuit of the electronic apparatus according to the first embodiment may distinguishingly operate in a sensing mode and an emission mode. The sensing mode may be divided into section (a) and section (b).

In section (a) of the sensing mode, RST(n) and Sens(n) may be applied at a low level, and Sel(n) and EM(n) may be applied at a high level. That is, in section (a) of the sensing mode, the seventh transistor M7 may be turned on so that the power source voltage ($ELV_{DD}$) is applied to the cathode of the light-emitting device 313, and the fourth transistor M4 may be turned on so that the ground voltage $ELV_{SS}$ is applied to the anode of the light-emitting device 313.

Here, the power source voltage ($ELV_{DD}$) may be a voltage having a higher level than that of the ground voltage $ELV_{SS}$ ($ELV_{DD} > ELV_{SS}$).

In other words, in section (a) of the sensing mode, a non-forward bias may be applied to the light-emitting device 313.

Here, when light is incident on the light-emitting device 313 in a state in which a non-forward bias is applied, an electrical signal may be generated.

More particularly, when light is incident on the light-emitting device 313, an electrical signal may flow from the cathode to the anode and exit to the ground voltage line through the fourth transistor M4.

Here, the voltage of a node corresponding to the cathode of the light-emitting device 313 may change depending upon the amount of the exited electrical signal, and a voltage applied to the gate terminal of the fifth transistor M5 may be changed due to the voltage change in the node corresponding to the cathode.

In section (b) of the sensing mode, Sel(n) connected to the gate terminal of the sixth transistor M6 may be applied at a low level so that the sixth transistor M6 is turned on. Here, the fifth transistor M5 may function as a source follower.

In addition, the read line, RL(n), may be connected to a sensing circuit. A constant current source may be connected to the sensing circuit. Accordingly, when a constant current flows through the read line, RL(n), a voltage change in the gate terminal of the fifth transistor M5 may be read.

In other words, since a change in voltage applied to the gate terminal of the fifth transistor M5 in each pixel is different when the intensity of incident light is different for each pixel, the electronic apparatus according to the first embodiment may read a signal sensed in each pixel in an active matrix driving manner and, as a result, may determine a change in light intensity for each pixel position in the sensing circuit.

In an emission mode, Scan(n) may be applied at a low level, and the data signal, Data(m), may be applied to the gate terminal of the second transistor M2 through the first transistor M1.

Here, when the second transistor M2 is turned on by the data signal, Data(m), a forward bias may be applied to the light-emitting device 313 by the relationship of $ELV_{DD} > ELV_{SS}$.

FIGS. 4A and 4B are drawings illustrating a pixel circuit according to a second embodiment of the present disclosure.

In other words, FIGS. 4A and 4B illustrate an embodiment of the pixel circuit of the electronic apparatus according to an embodiment of the present disclosure described with reference to FIGS. 1 to 3B. In describing FIGS. 4A and 4B, parts overlapping with those described in FIGS. 1 to 3B are omitted.

Referring to FIGS. 4A and 4B, reference numeral 410 denotes a detailed configuration of a pixel circuit according to the second embodiment included in a pixel corresponding to an nth scan line and an mth data line (wherein n and m are positive integers), and reference numeral 420 illustrates a timing diagram according to an operation of the pixel circuit according to the second embodiment.

As shown in reference numeral 410, the pixel circuit according to the second embodiment may include may include first to sixth transistors M1 to M6 constituting a light-emitting driver 411, a sensing driver 412 and a reader 414. All of the first to sixth transistors M1 to M6 may be constituted of PMOS transistors.

In addition, Scan(n) may be a scan signal applied to a gate terminal of the first transistor M1, Data(m) may be a data signal applied to a source terminal of the first transistor M1, EM(n) may be a signal applied to a gate terminal of the third transistor M3, Sens(n) may be a signal applied to a gate terminal of the fourth transistor M4, and Sel(n) may be a signal applied to a gate terminal of the sixth transistor M6.

Particularly, the light-emitting driver 411 according to an embodiment may include the first transistor M1 provided between a data line to which a data signal, Data(m), is applied and a power source voltage line to which a power source voltage, $ELV_{DD}$, is applied; and the second transistor M2 connected to a drain terminal of the first transistor M1 through a gate terminal and provided between the power source voltage line and an anode of a light-emitting device 313.

In addition, the light-emitting driver 411 may further include a capacitor provided between the drain terminal of the first transistor and the power source voltage line.

The sensing driver 412 may include the third transistor M3 provided between a cathode of the light-emitting device 413 and the first ground voltage line to which the first ground voltage ($ELV_{SS}$) is applied; and the fourth transistor M4 provided between an anode of the light-emitting device 413 and the second ground voltage line to which the second ground voltage ($ELV_{SS2}$) is applied.

In accordance with an aspect of the present disclosure, the level of the first ground voltage (ELVSS) applied through the first ground voltage line may be higher than the level of the second ground voltage (ELVSS2) applied through the second ground voltage lines ($ELV_{SS}>ELV_{SS2}$).

Meanwhile, the reader 414 may include a source follower transistor, the fifth transistor M5, connected to the cathode of the light-emitting device 413 through the gate terminal; and the sixth transistor M6 provided between the fifth transistor M5 and the read line, RL(n).

Hereinafter, an operation of the pixel circuit according to the second embodiment illustrated in reference numeral 410 is described in more detail with reference to reference numeral 420.

Referring to reference numerals 410 and 420, the pixel circuit of the electronic apparatus according to the embodiment may distinguishingly operate in a sensing mode and an emission mode. The sensing mode may be divided into section (a) and section (b).

In section (a) of the sensing mode, EM(n) and Sens(n) may be applied at a low level, and signal, Sel(n), may be applied at a high level. That is, the first ground voltage (ELVSS) may be applied to the cathode of the light-emitting device 413 when the third transistor M3 is turned on, and the second ground voltage (ELVSS2) may be applied to the anode of the light-emitting diode when the fourth transistor M4 is turned on.

In other words, a non-forward bias may be applied to the light-emitting device 413. Here, as described with reference to FIGS. 3A and 3B, an electrical signal may be generated when light is incident on the light-emitting device 413 in a state in which non-forward voltage is applied, and the generated electrical signal may exit to the second ground voltage line through the fourth transistor M4, so that voltage applied to the gate terminal of the fifth transistor M5 may be changed.

In section (b) of the sensing mode, Sel(n) applied to the gate terminal of the sixth transistor M6 may be applied at a low level, so that the sixth transistor M6 is turned on.

In section (b) of the sensing mode, the fifth transistor M5 may function as a source follower, the read line, RL(n), may be connected to a sensing circuit, and a current source may be connected to the sensing circuit, as described with reference to FIGS. 3A and 3B.

Accordingly, a change in the voltage applied to the gate terminal of the fifth transistor M5 may be read through the read line, RL(n). As a result, a change in light intensity may be determined for each pixel position in the sensing circuit.

FIGS. 5A and 5B are drawings illustrating a pixel circuit according to a third embodiment of the present disclosure.

In other words, FIGS. 5A and 5B illustrate an embodiment of the pixel circuit of the electronic apparatus according to an embodiment of the present disclosure described with reference to FIGS. 1 to 4B. In describing FIGS. 5A and 5B, parts overlapping with those described in FIGS. 1 to 4B are omitted.

Referring to FIGS. 5A and 5B, reference numeral 510 denotes a detailed configuration of a pixel circuit according to the third embodiment included in a pixel corresponding to an nth scan line and an mth data line (wherein n and m are positive integers), and reference numeral 520 illustrates a timing diagram according to an operation of the pixel circuit according to the third embodiment.

As shown in reference numeral 510, the pixel circuit according to the third embodiment may include may include first to fifth transistors M1 to M5 constituting a light-emitting driver 511, a sensing driver 512 and a reader 514. All of the first to sixth transistors M1 to M5 may be constituted of NMOS transistors.

In addition, Scan(n) may be a scan signal applied to a gate terminal of the first transistor M1, Data(m) may be a data signal applied to a drain terminal of the first transistor M1, RST(n) may be a signal applied to a gate terminal of the third transistor M3, and Sens(n) may be a signal applied to a gate terminal of the fourth transistor M4.

Particularly, the light-emitting driver 511 according to the third embodiment may include the first transistor M1 provided between a data line to which a data signal, Data(m), is applied and a ground voltage line to which ground voltage, $ELV_{SS}$(n), is applied; and the second transistor M2 connected to a source terminal of the first transistor M1 through a gate terminal and provided between a cathode of the light-emitting device 513 connected to a power source voltage line, to which the power source voltage $ELV_{DD}$ is applied, through an anode and a ground voltage line.

In addition, the light-emitting driver 511 according to the third embodiment may further include a capacitor provided between the source terminal of the first transistor M1 and the ground voltage line.

In addition, the sensing driver 512 may include the third transistor M3 provided between the cathode of the light-emitting device 513 and the ground voltage line. That is, the third transistor M3 may be connected in parallel with the second transistor M2.

In addition, the reader 314 may include a source follower transistor, the fifth transistor M5, connected to the cathode of the light-emitting device through the gate terminal; and the fourth transistor M4 provided between the fifth transistor M5 and the read line, RL(n).

Meanwhile, the ground voltage line may be applied with the second power source voltage (ELVDD2) that has a higher level than that of the first the power source voltage (ELVDD) applied to the power source voltage line, for a preset time section in a sensing mode ($ELV_{DD2}$>$ELV_{DD}$).

Hereinafter, an operation of the pixel circuit according to the third embodiment illustrated in reference numeral 510 is described in more detail with reference to reference numeral 520.

Referring to reference numerals 510 and 520, the pixel circuit of the electronic apparatus according to the third embodiment may distinguishingly operate in a sensing mode and an emission mode. The sensing mode may be divided into section (a) and section (b).

In section (a) of the sensing mode, RST(n) may be applied with a high level, and the second power source voltage (ELVDD2) may be applied through the ground voltage line to which the ground voltage, $ELV_{SS}$(n), is applied.

In other words, in section (a) of the sensing mode, a non-forward bias may be applied to the light-emitting device 513 according to the relationship of $ELV_{DD2}$>$ELV_{DD}$.

Accordingly, in section (a) of the sensing mode, an electrical signal may be generated when light is incident on the light-emitting device 513 in a state in which non-forward voltage is applied, and the generated electrical signal may exit through the power source voltage line to which the first power source voltage ELVDD is applied, so that voltage applied to the gate terminal of the fifth transistor M5 may be changed, as described with reference to FIGS. 3A and 3B.

In section (b) of the sensing mode, Sel(n) applied to the gate terminal of the fifth transistor M5 may be applied at a high level, so that the fifth transistor M5 may be turned on. In this section, the fifth transistor M5 may function as a source follower.

The read line may be connected to the sensing circuit, and the sensing circuit may be connected to a current source. Accordingly, a change in the voltage applied to the gate terminal of the fourth transistor M4 may be read through the read line. As a result, a change in light intensity may be determined for each pixel position in the sensing circuit.

FIG. 6 is a drawing illustrating a method of driving a pixel circuit of an electronic apparatus according to an embodiment of the present disclosure.

In other words, FIG. 6 is a drawing illustrating a method of driving the pixel circuit of the electronic apparatus according to an embodiment of the present disclosure described with reference to FIGS. 1 to 5b. In describing FIG. 6, parts overlapping with those described in FIGS. 1 to 5b are omitted.

In addition, steps 610 to 630 of the method illustrated in FIG. 6 may be sequentially performed, or step 610 may be performed after steps 620 and 630.

Referring to FIG. 6, in step 610 of the method of driving the pixel circuit according to an embodiment of the present disclosure, a forward bias may be applied to a light-emitting device, by a light-emitting driver, in an emission mode to control light to be emitted through the light-emitting device.

In accordance with the first and second embodiments, a light-emitting driver may include a first transistor provided between a data line and a power source voltage line; and a second transistor connected to a drain terminal of the first transistor through a gate terminal and provided between the power source voltage line and an anode of a light-emitting device.

In accordance with the third embodiment, a light-emitting driver may include a first transistor provided between a data line and a ground voltage line; and a second transistor connected to a source terminal of the first transistor through a gate terminal and provided between a cathode of a light-emitting device, connected to a power source voltage line through an anode, and the ground voltage line.

Next, in step 620 of the method of driving the pixel circuit according to an embodiment of the present disclosure, a non-forward bias may be applied to the light-emitting device, by the sensing driver, in a sensing mode to control an electrical signal corresponding to light incident on the light-emitting device to be generated.

In accordance with the first embodiment, a sensing driver may include a third transistor provided between a cathode of a light-emitting device and a ground voltage line; a fourth transistor provided between the ground voltage line and an anode of the light-emitting device; and a seventh transistor provided between a power source voltage line and the cathode of the light-emitting device.

In accordance with the second embodiment, a sensing driver may include a third transistor provided between a cathode of a light-emitting device and a first ground voltage line; and a fourth transistor provided between an anode of the light-emitting device and a second ground voltage line, and the first ground voltage line may be applied with a first ground voltage that has a higher level than that of a second ground voltage applied through the second ground voltage line.

In accordance with the third embodiment, a sensing driver may include a third transistor provided between a cathode of a light-emitting device and a ground voltage line.

In accordance with an aspect of the present disclosure, in step 620 of the method of driving the pixel circuit according to an embodiment of the present disclosure, a non-forward bias may be applied to the light-emitting device to control an electrical signal corresponding to light emitted from an adjacent pixel to be generated.

Next, in step 630 of the method of driving the pixel circuit according to an embodiment of the present disclosure, the intensity of light corresponding to the generated electrical signal may be read by a reader using a source follower transistor.

In conclusion, the electronic apparatus according to the present disclosure performs light emission and sensing functions using a light-emitting device in a pixel, instead of an external apparatus or a separate substrate, thereby being capable of realizing miniaturization and weight reduction of an electronic apparatus.

In addition, the electronic apparatus according to the present disclosure performs light emission and sensing functions in an active matrix driving manner, thereby being capable of shortening a detection time of light intensity change and more accurately detecting changes in light intensity due to relatively low crosstalk, compared to a passive matrix driving manner.

An electronic apparatus according to an embodiment of the present disclosure performs light emission and sensing functions using a light-emitting device in a pixel, instead of an external apparatus or a separate substrate, thereby being capable of realizing miniaturization and weight reduction of an electronic apparatus.

An electronic apparatus according to an embodiment of the present disclosure performs light emission and sensing functions in an active matrix driving manner, thereby being capable of shortening a detection time of light intensity change and more accurately detecting changes in light intensity due to relatively low crosstalk, compared to a passive matrix driving manner.

Although exemplary embodiments of the present disclosure have been disclosed for illustrative purposes, those skilled in the art will appreciate that various modifications, additions and substitutions are possible, without departing from the scope and spirit of the disclosure as disclosed in the accompanying claims. For example, a proper result may be achieved even if the techniques described above are implemented in an order different from that for the disclosed method, and/or disclosed constituents such as a system, structure, device and circuit are coupled to or combined with each other in a form different from that for the disclosed method or replaced by other constituents or equivalents.

It should be understood, however, that there is no intent to limit the disclosure to the embodiments disclosed, rather, the disclosure is to cover all modifications, equivalents, and alternatives falling within the spirit and scope of the disclosure as defined by the claims.

[Description of Symbols]

| | |
|---|---|
| 200: pixel circuit | 210: light-emitting driver |
| 220: sensing driver | 230: light-emitting device |
| 240: reader | |

What is claimed is:

1. A pixel circuit of an electronic apparatus, the pixel circuit comprising:
   a light-emitting driver configured to apply a forward bias to a light-emitting device in an emission mode to control light to be emitted through the light-emitting device;
   a sensing driver configured to apply a non-forward bias to the light-emitting device in a sensing mode to control an electrical signal corresponding to light incident on the light-emitting device to be generated; and
   a reader configured to read intensity of light corresponding to the generated electrical signal,
   wherein the reader comprises a source follower transistor, a fifth transistor, connected to a cathode of the light-emitting device through a gate terminal, and a sixth transistor provided between the fifth transistor and a read line.

2. The pixel circuit according to claim 1, wherein the light-emitting driver comprises a first transistor provided between a data line and a power source voltage line; and a second transistor connected to a drain terminal of the first transistor through a gate terminal and provided between the power source voltage line and an anode of the light-emitting device.

3. The pixel circuit according to claim 2, wherein the light-emitting driver further comprises a capacitor provided between the drain terminal of the first transistor and the power source voltage line.

4. The pixel circuit according to claim 2, wherein the sensing driver comprises a third transistor provided between a cathode of the light-emitting device and a ground voltage line; a fourth transistor provided between the ground voltage line and an anode of the light-emitting device; and a seventh transistor provided between the power source voltage line and the cathode of the light-emitting device.

5. The pixel circuit according to claim 2, wherein the sensing driver comprises a third transistor provided between a cathode of the light-emitting device and a first ground voltage line; and a fourth transistor provided between an anode of the light-emitting device and a second ground voltage line.

6. The pixel circuit according to claim 5, wherein the first ground voltage line is applied with a first ground voltage that has a higher level than that of a second ground voltage applied through the second ground voltage line.

7. The pixel circuit according to claim 1, wherein the sensing driver applies the non-forward bias to the light-emitting device to control the electrical signal corresponding to light emitted from an adjacent pixel to be generated.

8. A pixel circuit of an electronic apparatus, the pixel circuit comprising:
   a light-emitting driver configured to apply a forward bias to a light-emitting device in an emission mode to control light to be emitted through the light-emitting device;
   a sensing driver configured to apply a non-forward bias to the light-emitting device in a sensing mode to control an electrical signal corresponding to light incident on the light-emitting device to be generated; and
   a reader configured to read intensity of light corresponding to the generated electrical signal,
   wherein the light-emitting driver comprises a first transistor provided between a data line and a ground voltage line; and a second transistor connected to a source terminal of the first transistor through a gate terminal and provided between a cathode of the light-emitting device, which is connected to a power source voltage line through an anode, and the ground voltage line,
   wherein the sensing driver comprises a third transistor provided between the cathode of the light-emitting device and the ground voltage line.

9. The pixel circuit according to claim 8, wherein the light-emitting driver further comprises a capacitor provided between the source terminal of the first transistor and the ground voltage line.

10. The pixel circuit according to claim 8, wherein the ground voltage line is applied with a second power source voltage that has a higher level than that of a first power source voltage applied to the power source voltage line, for a preset time section in the sensing mode.

11. A method of driving a pixel circuit of an electronic apparatus, the method comprising:
    applying, by a light-emitting driver, a forward bias to a light-emitting device in an emission mode to control light to be emitted through the light-emitting device;
    applying, by a sensing driver, a non-forward bias to the light-emitting device in a sensing mode to control an electrical signal corresponding to light incident on the light-emitting device to be generated; and
    reading, by a reader, intensity of light corresponding to the generated electrical signal,
    wherein the reader comprises a source follower transistor, a fifth transistor, connected to a cathode of the light-emitting device through a gate terminal, and a sixth transistor provided between the fifth transistor and a read line.

12. The method according to claim 11, in the applying of the non-forward bias, the non-forward bias is applied to the light-emitting device to control the electrical signal, which corresponds to light emitted from an adjacent pixel, to be generated.

\* \* \* \* \*